(12) United States Patent
Momota

(10) Patent No.: US 9,443,942 B2
(45) Date of Patent: Sep. 13, 2016

(54) SEMICONDUCTOR DEVICE

(71) Applicant: FUJI ELECTRIC CO., LTD., Kawasaki (JP)

(72) Inventor: Seiji Momota, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/154,778

(22) Filed: Jan. 14, 2014

(65) Prior Publication Data

US 2014/0210037 A1   Jul. 31, 2014

(30) Foreign Application Priority Data

Jan. 30, 2013  (JP) ................. 2013-015971

(51) Int. Cl.
*H01L 29/40* (2006.01)
*H01L 29/861* (2006.01)
*H01L 29/06* (2006.01)

(52) U.S. Cl.
CPC ......... *H01L 29/402* (2013.01); *H01L 29/0615* (2013.01); *H01L 29/8611* (2013.01)

(58) Field of Classification Search
CPC . H01L 29/402; H01L 29/8611; H01L 29/861
USPC ....... 257/484, 483, 409, 127, 172, 170, 605, 257/E29.012
See application file for complete search history.

(56) References Cited

U.S. PATENT DOCUMENTS

| 4,009,483 | A | * | 2/1977 | Clark ........................ 257/489 |
| 4,567,502 | A | * | 1/1986 | Nakagawa et al. ......... 257/490 |
| 5,477,077 | A | | 12/1995 | Kumagai et al. |
| 5,510,634 | A | * | 4/1996 | Okabe ................. H01L 29/0626 257/139 |
| 5,804,868 | A | * | 9/1998 | Kobayashi et al. .......... 257/630 |
| 6,407,413 | B1 | * | 6/2002 | Kawamoto ......... H01L 27/0255 257/133 |
| 9,117,739 | B2 | * | 8/2015 | Zhang ................. H01L 29/1608 257/472 |
| 2002/0179974 | A1 | * | 12/2002 | Noda ................... H01L 27/0629 257/369 |
| 2003/0218220 | A1 | * | 11/2003 | Takahashi ........... H01L 29/0619 257/409 |
| 2005/0056912 | A1 | * | 3/2005 | Ninomiya et al. ............ 257/565 |
| 2008/0001159 | A1 | * | 1/2008 | Ota ........................ H01L 29/872 257/77 |
| 2010/0019342 | A1 | * | 1/2010 | Kawano et al. .............. 257/494 |
| 2010/0289110 | A1 | * | 11/2010 | Tarui et al. ................... 257/490 |

FOREIGN PATENT DOCUMENTS

JP           06-077506 H      3/1994
JP    WO 2013046908 A1 *     4/2013   .......... H01L 29/8611

* cited by examiner

*Primary Examiner* — Michele Fan

(74) *Attorney, Agent, or Firm* — Rabin & Berdo, P.C.

(57) ABSTRACT

A power diode is disclosed wherein it is possible to lower on-voltage by expanding a conducting region at an on time. By applying negative voltage to a plate electrode when turning on a power diode, an inversion layer is formed in a front surface layer of an n drift region sandwiched between a p guard ring region and a p anode region, and the p guard ring region and p anode region are connected by the inversion layer, thereby causing one portion or all of the p guard ring region to function as an active region together with the anode region, and expanding an energization region, thus lowering on-voltage.

10 Claims, 10 Drawing Sheets

SEMICONDUCTOR DEVICE

CROSS REFERENCE TO RELATED APPLICATION

The entire disclosure of the inventor's corresponding Japanese patent application, Serial No. JP PA 2013-015971, filed Jan. 30, 2013, is hereby incorporated by reference.

BACKGROUND OF THE INVENTION

1. Field of the Invention

The present invention relates to a semiconductor device such as a power diode.

2. Description of the Background Art

FIGS. 8A and 8B are configuration diagrams of a heretofore known power diode 500, wherein FIG. 8A is a main portion plan view, and FIG. 8B is a main portion sectional view taken along the line X-X of FIG. 8A. The power diode (hereafter, simply called the diode) is a vertical diode.

The diode 500 includes an active region 11 formed of a p anode region 2, a p guard ring region 3 configuring a breakdown voltage structure 16 surrounding the active region 11, and an insulating film 4 (for example, an oxide film) which is a protection film on the p guard ring region 3. To describe in further detail, the diode 500 includes the p anode region 2 disposed in the front surface of an n semiconductor substrate 1, the p guard ring region 3 disposed so as to surround the p anode region 2, the insulating film 4 disposed on the p guard ring region 3, an n cathode region 6 disposed on the rear surface of the n semiconductor substrate 1, an anode electrode 7 disposed on the p anode region 2, and a cathode electrode 8 on the n cathode region 6. The p guard ring region 3 is configured of ring-shaped $p^+$ regions 3a, and a region of the n semiconductor substrate 1 in which no diffusion regions are formed forms an n drift region 1a. Herein, the diffusion regions refer to regions, such as the p anode region 2, $p^+$ regions 3a, and n cathode region 6, which are formed by diffusing or injecting impurities from or into the surface of the n semiconductor substrate 1.

When the diode 500 is put into an on state, holes are injected into the n drift region 1a from the p anode region 2, and electrons are injected into the n drift region 1a from the n cathode region 6 so as to neutralize the holes. Conductivity modulation thus occurs in the n drift region 1a, the on-resistance of the diode decreases, and on-voltage reaches a low value. Herein, a forward voltage drop of the diode is called on-voltage.

Also, when reverse current for cancelling forward current is caused to flow in order to put the diode 500 into an off state, the holes and electrons accumulated in the n drift region 1a are swept to the outside, reverse recovery current flows, reverse voltage is applied to the diode 500, and the diode 500 attains the off state.

Owing to the reverse voltage, a depletion layer expands from the pn junction of the p anode region 2 and n drift region 1a to the n drift region 1a. The depletion layer expanding laterally, on reaching the p guard ring region 3, further expands while leaping over the $p^+$ regions 3a configuring the p guard ring region 3, one $p^+$ region 3a after another. The width of the depletion layer expanding laterally increases in this way, meaning that field intensity on the surface decreases, and breakdown voltage on the surface is stably maintained.

Also, in JP-A-6-77506, in a power pin diode wherein an anode region is formed of a Schottky barrier junction and a pn junction, a p floating region is provided in an active region so as to be adjacent to the p anode region, and a MOS gate structure is provided between the p anode region and p floating region. At an on time, negative voltage is applied to a MOS gate, thus forming a p channel region, and the p anode region and p floating region are connected to expand an energization region, thus lowering on-voltage. When turning off the power pin diode, the MOS gate is turned off prior thereto, the p floating region is separated from the p anode region, and subsequently, reverse current for cancelling forward current is caused to flow, thus turning off the diode. The forward current decreases owing to the reverse current, excess holes and electrons are swept to the outside, and thus decrease. By further causing reverse current to flow, reverse recovery current flows through the pn junction and Schottky barrier junction, and excess holes and electrons are extinguished, thus attaining an off state. As the reverse recovery current in the Schottky barrier junction is low, reverse recovery current and reverse recovery loss decrease as compared with a power pin diode wherein the whole of an active region is formed of a pn junction. In this way, JP-A-6-77506 discloses measures whereby it is possible to lower both on-voltage and reverse recovery loss in the power pin diode.

However, in the heretofore known diode 500 of FIGS. 8A and 8B, in particular, when it is a high-voltage diode, the proportion of the p guard ring region 3 in a semiconductor chip increases, and when the area of the chip is the same, the active region 11 decreases in the same proportion, and the on-voltage rises.

Also, in JP-A-6-77506, as the floating region is provided in the active region, anode current flows to the floating region, which is not connected to an anode electrode, via the anode region. As the current flowing to the floating region flows to a conductivity modulation layer while flowing laterally through the floating region, the on-voltage rises as compared with when the whole of the active region is formed as the anode region. That is, with the structure of JP-A-6-77506, a conducting area decreases equivalently, as compared with when the whole of the active region is formed as the anode region.

Also, it is not described in JP-A-6-77506 that a guard ring provided in the outer peripheral portion of the active region is connected to the anode region, thus lowering the on-voltage.

SUMMARY OF THE INVENTION

An object of the invention is to solve the heretofore described problems, and thus provide a semiconductor device wherein it is possible to lower on-voltage by expanding a conducting region at an on time.

In order to achieve the object, according to a first aspect of the invention, a semiconductor device is configured including a second conductivity type first semiconductor region disposed in a front surface layer of a first conductivity type semiconductor substrate; a second conductivity type guard ring region which is a breakdown voltage structure disposed surrounding the first semiconductor region; an insulating film extending from on the end portion of the first semiconductor region to the guard ring region; a conductive film disposed on the semiconductor substrate sandwiched between the end portion of the first semiconductor region and the guard ring region, and on the guard ring region, via the insulating film; and a main electrode, disposed on the first semiconductor region, which is spaced away from the conductive film.

Also, according to a second aspect of the invention, in the semiconductor device of the first aspect of the invention, it is preferable to adopt a configuration wherein the guard ring region is formed of a plurality of second conductivity type second semiconductor regions of high concentration, the conductive film is divided into ring shapes, and the divided ring-shaped conductive films are disposed, via the insulating film, on the semiconductor substrate sandwiched between the first semiconductor region and guard ring region and on the semiconductor substrate sandwiched between the adjacent second semiconductor regions.

Also, according to a third aspect of the invention, in the semiconductor device of the first aspect or the second aspect of the invention, it is preferable that one portion of the semiconductor substrate forms the main electrode and a Schottky barrier junction.

Also, according to a fourth aspect of the invention, in the semiconductor device of any one of the first aspect to the third aspect of the invention, it is preferable that the first conductivity type semiconductor substrate is an n-type semiconductor substrate, the second conductivity type first semiconductor region is a p-type anode region, the second conductivity type guard ring region is a p-type guard ring region, the second conductivity type second semiconductor regions are p-type regions of high concentration, and the conductive film is a plate electrode.

Also, according to a fifth aspect of the invention, in the semiconductor device of any one of the first aspect to the fourth aspect of the invention, it is preferable that voltage at which inversion layers are formed in the front surface layer of the semiconductor substrate is applied to the conductive film at an on time, and voltage at which the inversion layers are extinguished is applied to the conductive film at an off time.

According to the invention, the guard ring region and anode region are connected by the inversion layers when turning on the semiconductor device, thereby expanding the conducting region, and it is thus possible to lower the on-voltage.

BRIEF DESCRIPTION OF THE DRAWINGS

FIGS. 1A and 1B are configuration diagrams of a semiconductor device 100 according to Embodiment 1 of the invention, wherein FIG. 1A is a main portion plan view, and FIG. 1B is a main portion sectional view taken along the line X-X of FIG. 1A.

FIGS. 3A to 3C are diagrams illustrating an operation of a diode of the invention, wherein FIG. 3A is a diagram when in an on state, FIG. 3B is a diagram when in transition to an off state, and FIG. 3C is a diagram when in the off state.

FIGS. 8A and 8B are configuration diagrams of a heretofore known power diode 500, wherein FIG. 8A is a main portion plan view, and FIG. 8B is a main portion sectional view taken along the line X-X of FIG. 8A.

DETAILED DESCRIPTION OF THE INVENTION

Hereafter, a description will be given, referring to the attached drawings, of a preferred embodiment of a semiconductor device according to the invention. In the following description, a first conductivity type is an n type, and a second conductivity type is a p type. Also, a first semiconductor region is a p anode region, and a second semiconductor region is a p region of high concentration. Also, p denotes that the conductivity type is the p type, while n denotes that the conductivity type is the n type, and + superscripted to each of p and n denotes that the impurity concentration is high. Also, portions the same as heretofore known are given the same reference signs.

Embodiment 1

Figure 1A:
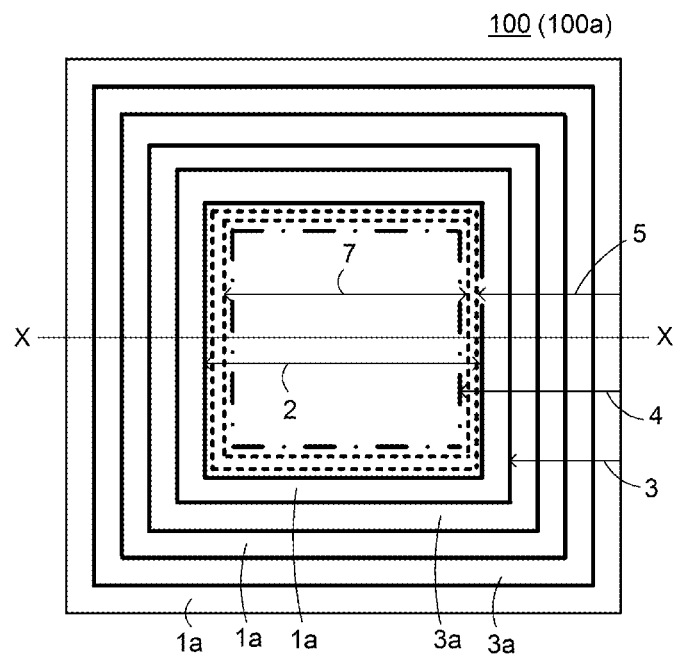
Figure 1B:
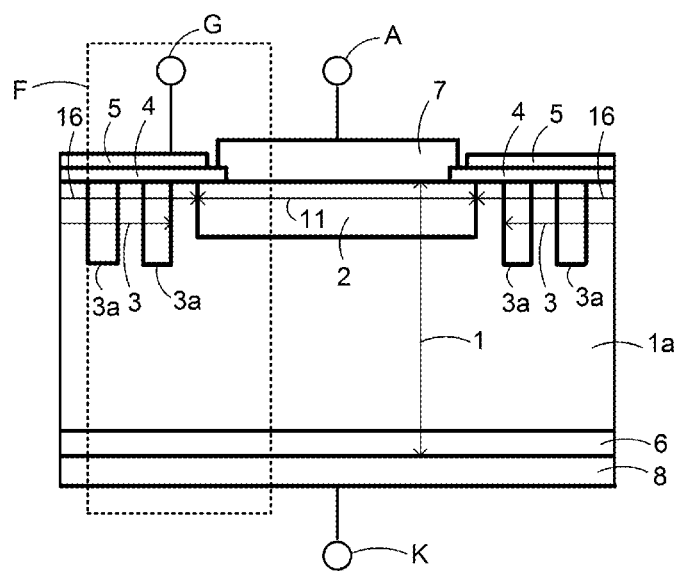
Figure 2:
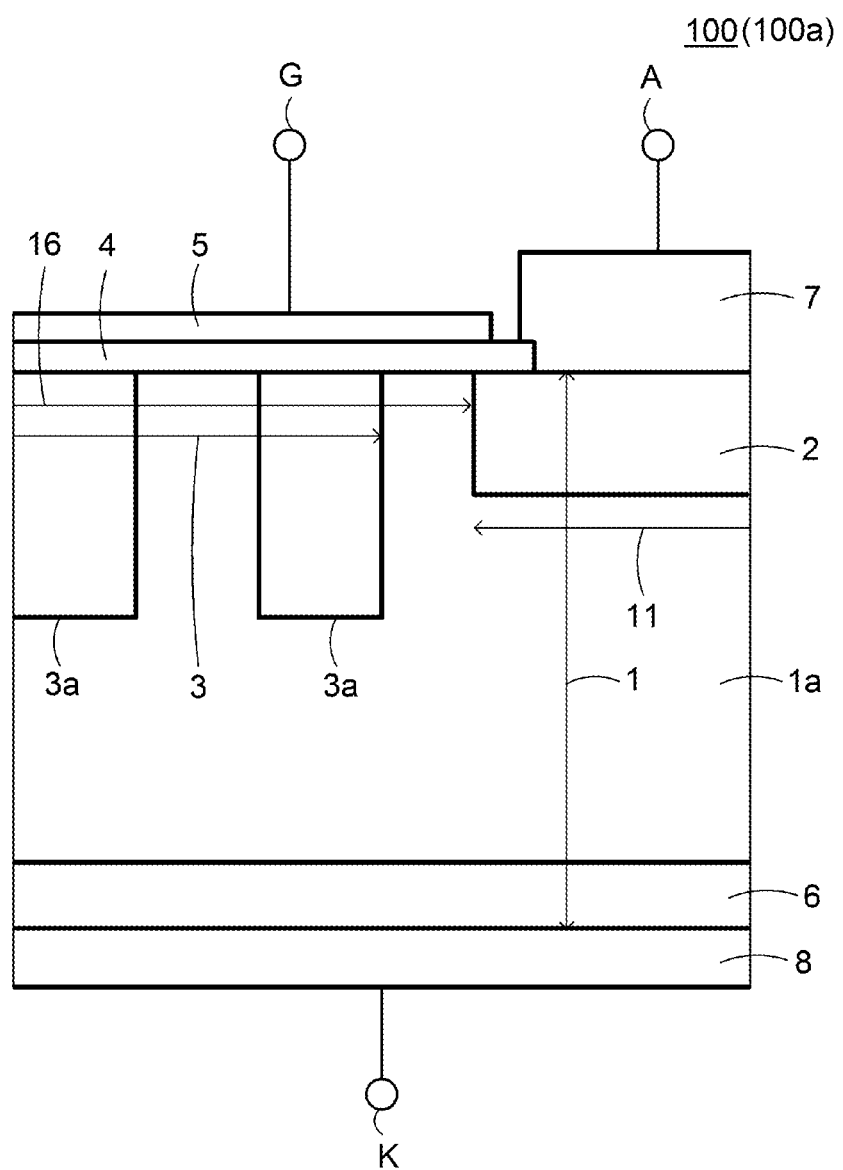
FIG. 2 is an enlarged view of the F portion of FIG. 1B.

FIGS. 1A, 1B, and 2 are configuration diagrams of a semiconductor device 100 according to Embodiment 1 of the invention, wherein FIG. 1A is a main portion plan view, FIG. 1B is a main portion sectional view taken along the line X-X of FIG. 1A, and FIG. 2 is an enlarged view of the F portion of FIG. 1B. The semiconductor device 100 is a power diode and a vertical diode 100a.

The diode 100a includes an active region 11 formed of a p anode region 2, a p guard ring region 3 configuring a breakdown voltage structure 16 surrounding the active region 11, and a plate electrode 5 disposed on the p guard ring region 3 via an insulating film 4 (for example, an oxide film). The plate electrode 5 is formed from, for example, polysilicon. Next, to describe in further detail, the diode 100a includes the p anode region 2 disposed in the front surface of an n semiconductor substrate 1, the p guard ring region 3 disposed so as to surround the p anode region 2, the plate electrode 5 disposed on the p guard ring region 3 via the insulating film 4 extending from on the end portion of the p anode region 2, an n cathode region 6 disposed on the rear surface of the n semiconductor substrate 1, an anode electrode 7 disposed on the p anode region 2, and a cathode electrode 8 on the n cathode region 6. The p guard ring region 3 is configured of ring-shaped p$^+$regions 3a, and a region of the n semiconductor substrate 1 in which no diffusion regions are formed forms an n drift region 1a. The insulating film 4 and plate electrode 5 act respectively like the gate oxide film and gate electrode of a MOS gate structure.

Also, the diffusion depths of the p anode region 2 and p guard ring region 3 may be the same or may be different. The diffusion depth is determined by the optimal design of each of the p anode region 2 and p guard ring region 3.

Figure 3A:
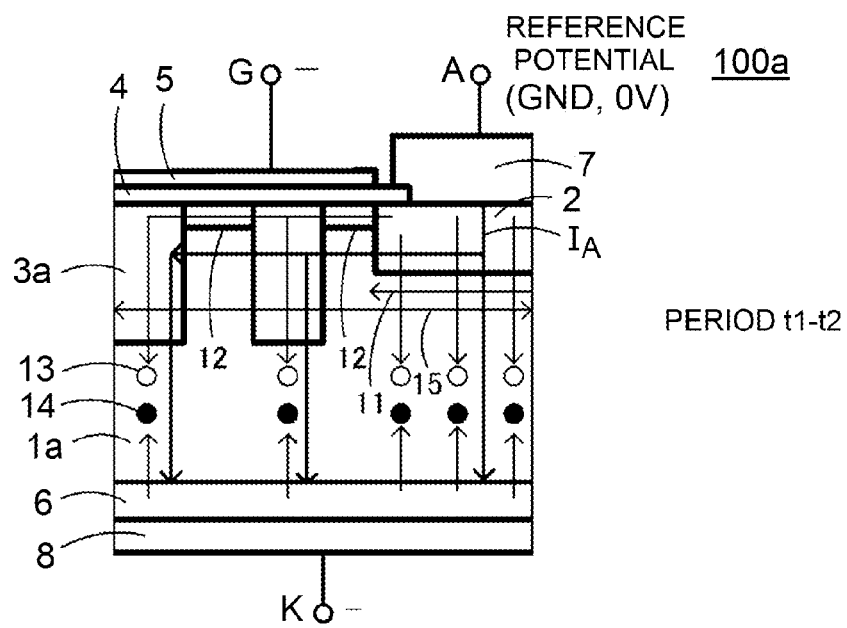
Figure 3B:
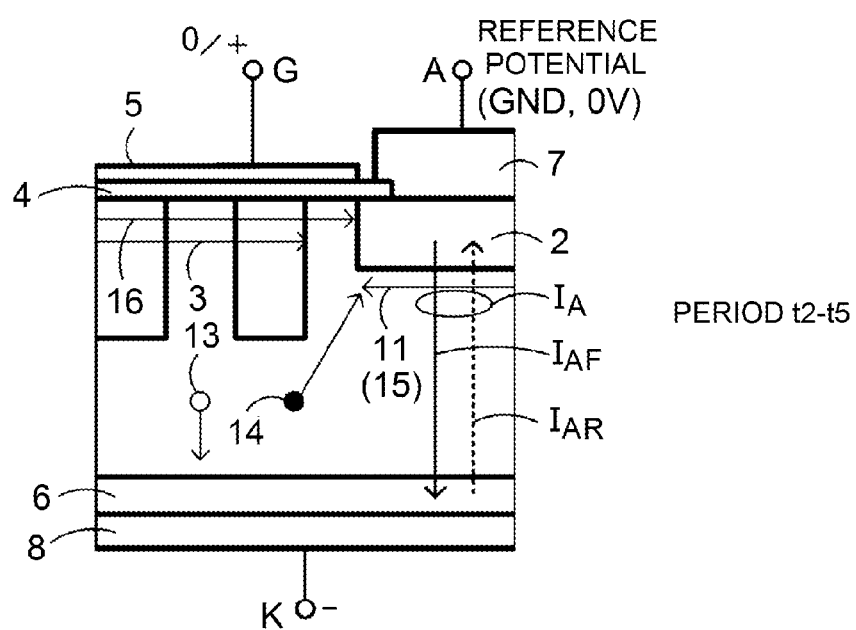
Figure 3C:
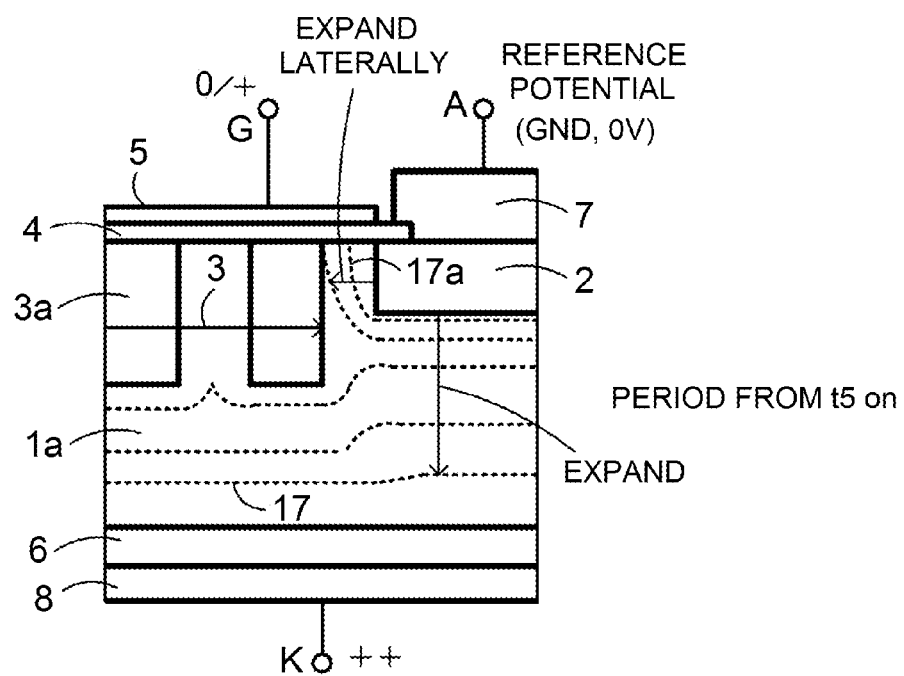
Figure 4:
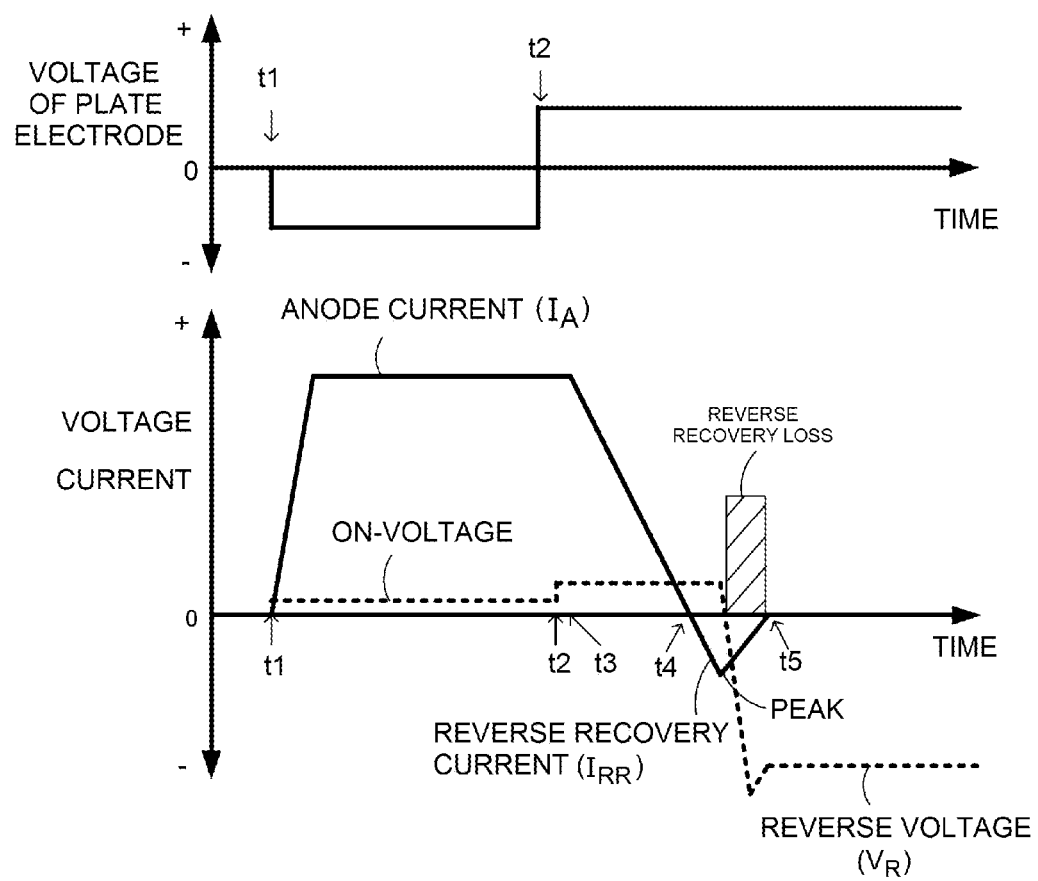
FIG. 4 is an operation waveform diagram of the diode.

FIGS. 3A to 3C and 4 are diagrams illustrating an operation of the diode 100a of FIGS. 1A and 1B, wherein FIG. 3A is a diagram when in an on state, FIG. 3B is a diagram when in transition to an off state, and FIG. 3C is a diagram when in the off state, while FIG. 4 is an operation waveform diagram of the diode 100a of FIG. 1. The operation will be described using FIGS. 3A to 3B and 4.

In FIGS. 3A and 4, when in the on state, at a point t1, negative voltage is applied to a cathode terminal K with an anode terminal A of the diode 100a set at a reference potential (GND (a ground potential) or 0V), thereby forward biasing the diode 100a, and negative voltage is applied to the plate electrode 5 with the potential of the anode terminal A as the reference. A point at which the diode 100a is forward biased and a point at which the negative voltage is applied to the plate electrode 5 do not always have to be caused to coincide with each other. By applying the negative voltage to the plate electrode 5, inversion layers 12 (p channel layers) are formed in front surface layers of the n drift region 1a sandwiched, one between the p anode region 2 and p guard ring region 3, and the others between the adjacent p$^+$regions 3a configuring the p guard ring region 3. The p anode region 2 and p guard ring region 3 are connected by the formation of the inversion layers 12. Holes 13 are injected into the n drift region 1a from the p anode region 2 and p guard ring region 3, and electrons 14 are injected into the n drift region 1a from the n cathode region 6 so as to neutralize the holes 13. Conductivity modulation thus occurs in the n drift region 1a, and on-voltage reaches a low value. In particular, as anode current $I_A$ flows through the p guard ring region 3 too, an energization region 15 expands, and the on-voltage drops significantly. The expanse of the energization region 15 leads to an equivalent expanse of the active region 11. Some holes 13 are injected from the inversion layers 12 (p channel layers) too.

Next, in FIGS. 3B and 4, when in transition to the off state, at a point t2, the negative voltage being applied to the plate electrode 5 is changed to 0V or positive voltage, and the inversion layers 12 are extinguished, thus separating the p guard ring region 3 from the p anode region 2. The p guard ring region 3, by being separated from the p anode region 2, acts as the original breakdown voltage structure 16. Also, in this condition, as the energization region 15 is reduced to the same size as the active region 11, the on-voltage rises to some extent. At a point t3, when reverse current $I_{AR}$ for cancelling forward current $I_{AF}$ flowing through the diode 100a is caused to flow, the holes 13 and electrons 14 accumulated in the n drift region 1a are swept to the outside, and the anode current $I_A$ ($=I_{AF}-I_{FR}$) decreases. When reverse recovery current $I_{RR}$ flows at a point t4, the accumulated holes 13 and electrons 14 flow to the p anode region 2 and n cathode region 6 respectively, and decrease. At a point at which the reverse recovery current $I_{RR}$ reaches a peak, reverse voltage $V_R$ (a cathode electrode K has positive voltage with the potential of an anode electrode A as the reference) is applied to the diode 100a. Owing to the reverse voltage $V_R$, a depletion layer 17 expands in the n drift region 1a, and residual holes 13 and electrons 14 are swept out to the p anode region 2 and n cathode region 6 respectively, and thus extinguished. As a matter of course, recombination is also added to this.

Next, in FIGS. 3C and 4, the steady off state is reached at a point t5, and the expanse of the depletion layer 17 stops.

By applying the reverse voltage $V_R$, the depletion layer 17 expands vertically and laterally from the pn junction of the p anode region 2 and n drift region 1a into the n drift region 1a. A depletion layer 17a expanding laterally, on reaching the p$^+$regions 3a configuring the p guard ring region 3, further expands laterally while leaping over one p$^+$region 3a after another. The width of the depletion layer 17a expanding laterally increases in this way, meaning that field intensity on the surface decreases, and breakdown voltage on the surface is maintained stabilized.

By connecting the p guard ring region 3 to the p anode region 2 at an on time and separating the p guard ring region 3 from the p anode region 2 at an off time in this way, it is possible to lower the on-voltage without affecting the breakdown voltage.

Also, the voltage applied to the plate electrode 5 is switched to 0V or the positive voltage via a plate terminal G prior to a transition to the off state, and subsequently, a transition is made to the off state, thereby enabling the on-voltage to have the same level as the reverse recovery current $I_{RR}$ when the anode current $I_A$ is caused to flow through only the active region 11. Because of this, with the diode 100a of the invention, as it is possible to reduce the on-voltage without increasing the reverse recovery current $I_{RR}$, it is possible to improve the trade-off between the on-voltage and reverse recovery current (reverse recovery loss).

In a high-voltage diode, there is high voltage in the vicinity of the lateral end portion of the depletion layer 17 (in the vicinity of the end portion of a chip) shown in FIG. 3C. Because of this, high voltage is applied to the insulating film 4 between the plate electrode 5 and the vicinity of the end portion (not shown) of the depletion layer 17, meaning that there occurs a case in which the insulating film 4 is dielectrically broken down. In order to prevent this, it is often the case that the plate electrode 5 is not formed on the p$^+$regions 3a in the vicinity of the end portion of the depletion layer 17. For example, it is good that the outer peripheral side end portion of the plate electrode 5 is positioned on the second and third p$^+$regions 3a from the anode electrode 7 side, thus preventing the plate electrode 5 from being formed on the p$^+$regions 3a in the outer peripheral portion away from the second and third p$^+$regions 3a.

Also, the diode 100a configures an inverter circuit or the like. For example, it is often the case that the diode 100a is used as a free wheel diode combined with insulated gate bipolar transistors (IGBTs) or the like.

Working Example 1

Figure 5:
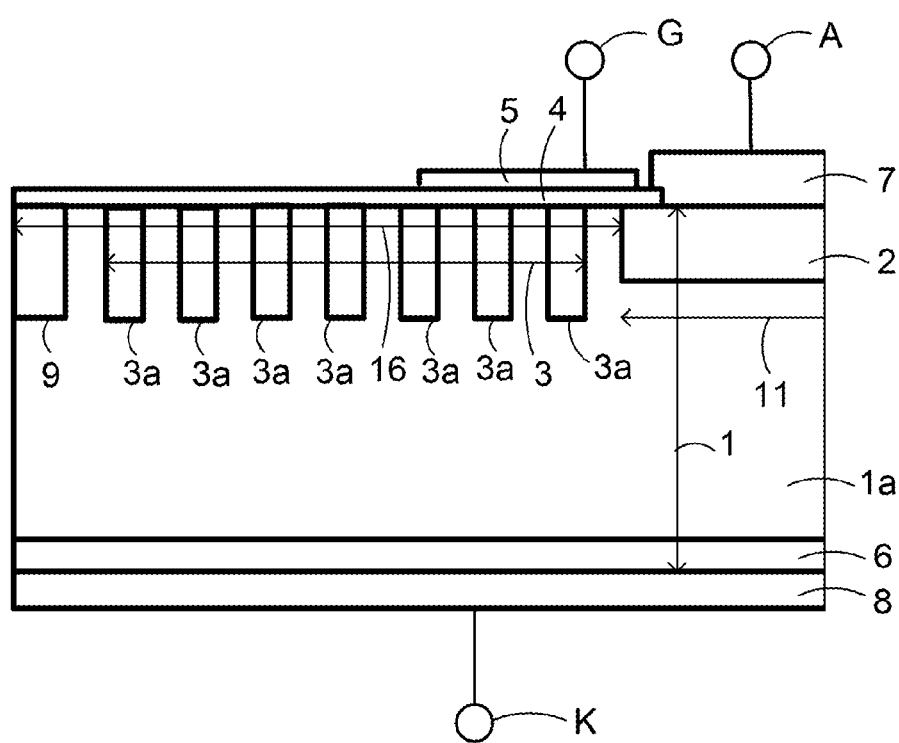
FIG. 5 is a main portion sectional view of a semiconductor device 200 according to Working Example 1 of the invention.

Working Example 1 is an example wherein Embodiment 1 is applied to a diode with a breakdown voltage of 600V. FIG. 5 shows a main portion sectional view of a semiconductor device 200 according to Working Example 1 of the invention. The semiconductor device 200 is a power diode which is formed of the active region 11, formed of the p anode region 2, and the breakdown voltage structure 16 surrounding the active region 11.

The breakdown voltage structure 16 is formed of the p guard ring region 3, formed of, for example, seven p$^+$regions 3a, a p-type channel stopper region 9 disposed in the outermost periphery away from the p guard ring region 3, the insulating film 4 formed from an oxide film on the p guard ring region 3 and channel stopper region 9, and the plate electrode 5 disposed via the insulating film 4.

Herein, as high voltage is applied to the outer peripheral side insulating film 4 close to the channel stopper region 9, as heretofore described, the outer peripheral side end portion of the plate electrode 5 is set to be on the third p$^+$region 3a from the active region 11. Also, the channel stopper region 9 is set to be of p type this time, but may be set to be of n type. Also, it is also possible to provide a field plate on the channel stopper region. Also, when raising the breakdown voltage, it is possible to respond thereto by increasing the number of p$^+$regions 3a and thus increasing the width of the p guard ring region 3.

With this diode, it is confirmed that the diode is put into the on state by applying negative voltage to the cathode terminal K with the anode terminal A set at 0V, and furthermore, the on-voltage of the diode drops by applying negative voltage to the plate terminal G. Also, it can be confirmed that when switching the negative voltage of the cathode terminal K to positive voltage and thus putting the diode into the off state, the voltage applied to the plate terminal G is switched to positive voltage prior thereto, as a result of which the reverse recovery current $I_{RR}$ is of the same level as when the anode current $I_A$ is caused to flow through only the active region 11.

Working Example 2

Figure 6:
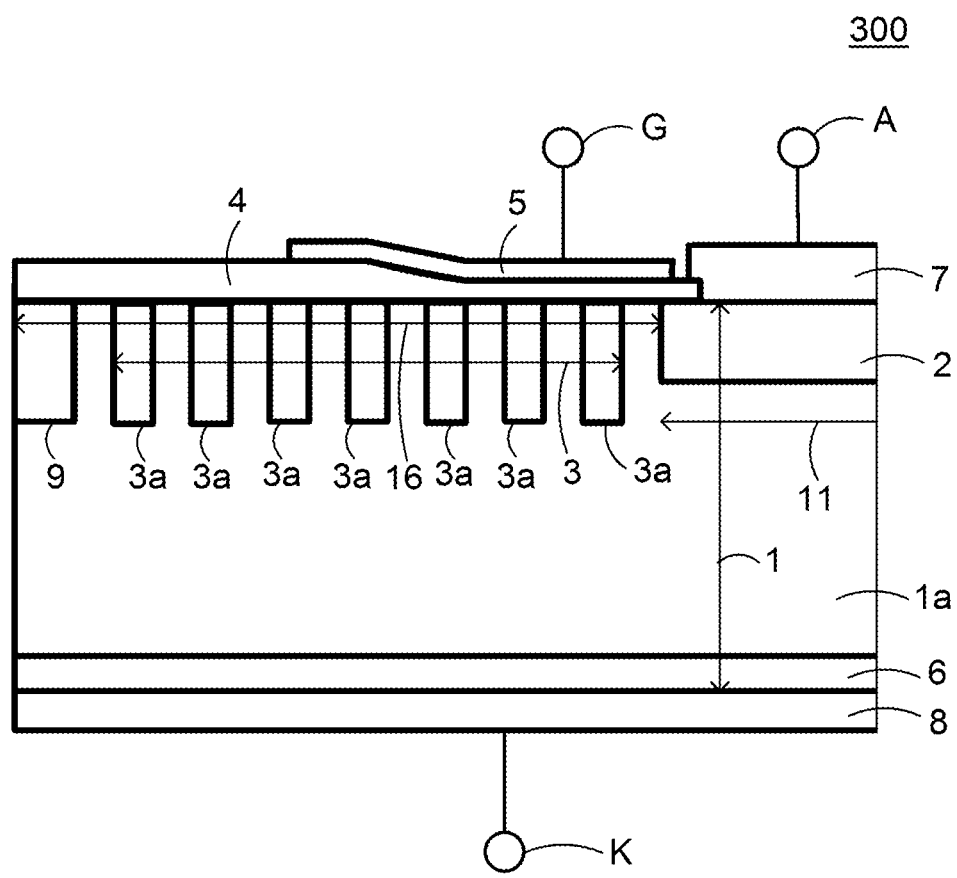
FIG. 6 is a main portion sectional view of a semiconductor device 300 according to Working Example 2 of the invention.

FIG. 6 is a main portion sectional view of a semiconductor device 300 according to Working Example 2 of the invention. The difference of the semiconductor device 300 from the semiconductor device 200 of FIG. 5 is that the outer peripheral side of the insulating film 4 starting from the third p⁺region 3a from the active region 11 is increased in thickness. By adopting this kind of structure, it is possible to relax an electric field applied to the outer peripheral side insulating film 4 when the n drift region 1a, when reverse biasing, rises in potential toward the outer peripheral side, and there occurs a possibility that the insulating film 4 may be broken down on the outer peripheral side of the plate electrode 5. Also, the plate electrode 5 is extended from the active region 11 to the fifth p⁺region 3a.

In Working Example 2, it can be confirmed that when voltage such that an inversion layer is formed in only a region in which the insulating film 4 is thin is applied to the plate terminal G, there are the same advantageous effects as in Working Example 1. Herein, the number of plate terminals G does not always have to be one, and it is also possible to divide the plate electrode 5 into a plurality of regions corresponding to the thickness of the insulating film 4, and provide a plurality of plate terminals G, one in each of the plurality regions.

Working Example 3

Figure 7:
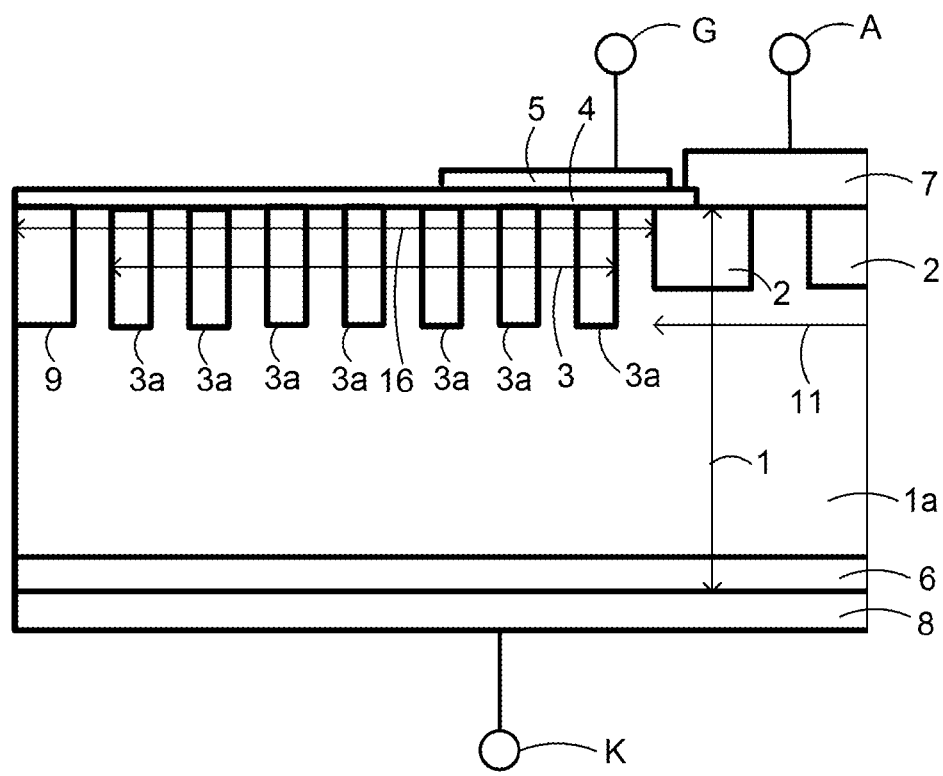
FIG. 7 is a main portion sectional view of a semiconductor device 400 according to Working Example 3 of the invention.
Figure 8A:
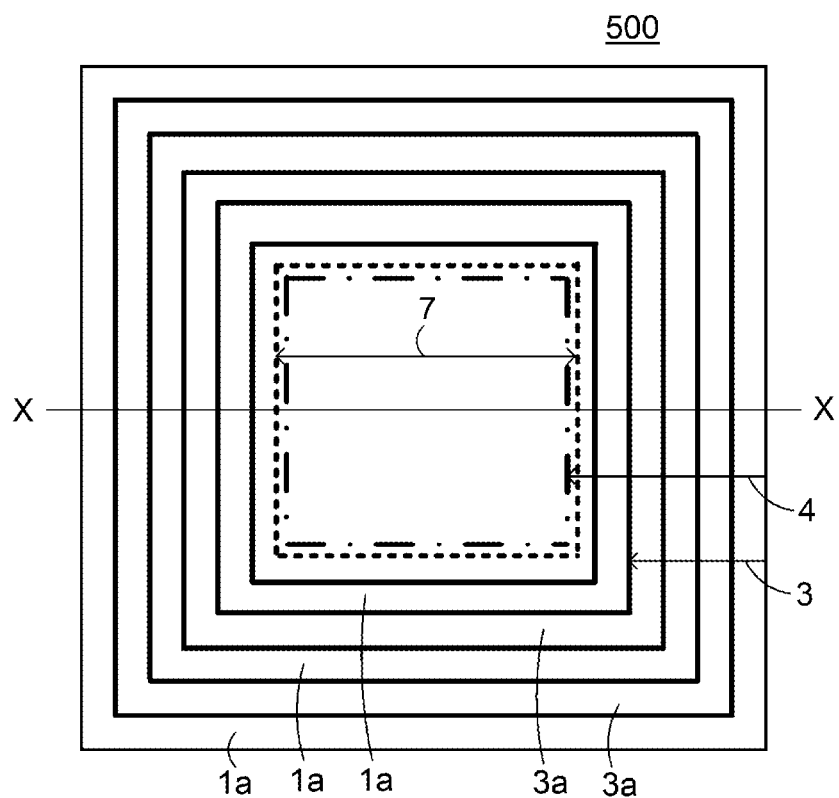
Figure 8B:
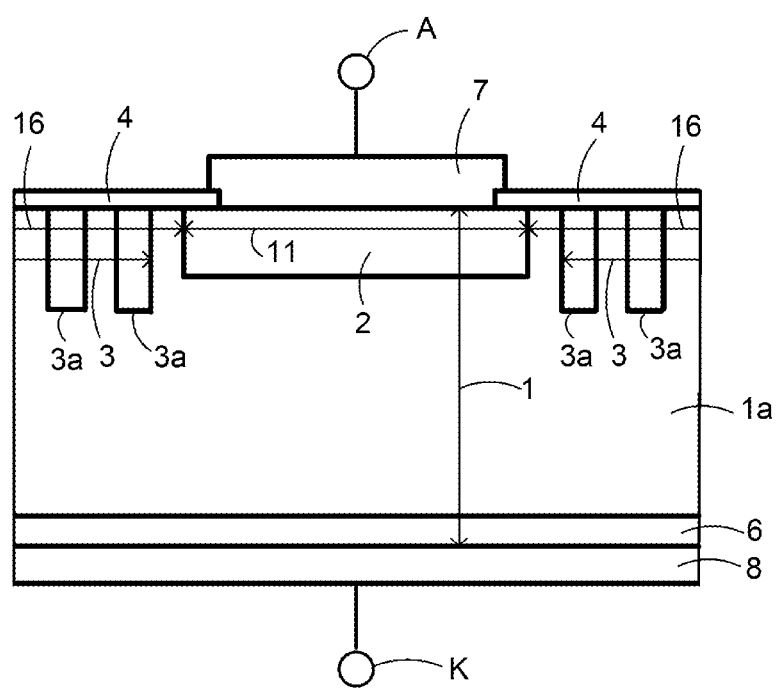

FIG. 7 is a main portion sectional view of a semiconductor device 400 according to Working Example 3 of the invention. The difference of the semiconductor device 400 from the semiconductor device 200 in FIG. 5 is that the n drift region 1a and anode region 7 in the active region 11 form a Schottky barrier junction 18, and the Schottky barrier junction 18 is connected in parallel to a pn junction formed of the p anode region 2 and n drift region 1a. In this case, there are the same advantageous effects as in Working Example 1, and it is possible to lower the reverse recovery current $I_{RR}$ by providing the Schottky barrier junction 18. It is a matter of course that this structure can be applied to the semiconductor device 300 too.

What is claimed is:

1. A semiconductor device, comprising:
a first conductivity type semiconductor substrate;
a second conductivity type first semiconductor region that is disposed in a front surface layer of the first conductivity type semiconductor substrate;
a second conductivity type guard ring region that is a breakdown voltage structure disposed surrounding the first semiconductor region, the guard ring region including a plurality of guard rings;
an insulating film that extends from an end portion of the first semiconductor region and formed to continuously extend over the plurality of guard rings;
a conductive film that is disposed on the semiconductor substrate so as to be sandwiched between the end portion of the first semiconductor region and an end portion of the guard ring region, and on the guard ring region via the insulating film; and
a main electrode, disposed on the first semiconductor region, which is spaced away from the conductive film,
wherein the insulating film is formed between the second conductivity type guard ring region and the conductive film without a trench in the insulating film reaching the second conductivity type guard ring region,
wherein the guard rings are disposed relative to each other and the first semiconductor region so that
an on-time voltage, which is applied to the conductive film at an on-time, forms inversion layers in the front surface layer of the semiconductor substrate, the inversion layers connecting the guard rings to the first semiconductor region, and further connecting the guard rings to each other, and
an off-time voltage, which is applied to the conductive film at an off-time, extinguishes the inversion layers.

2. The semiconductor device according to claim 1, wherein:
the guard rings are second conductivity type second semiconductor regions each having a high concentration;
the conductive film is divided into ring shapes; and
the divided ring-shaped conductive films are disposed, via the insulating film, on a portion of the semiconductor substrate that is sandwiched between the first semiconductor region and the guard ring region and on another portion of the semiconductor substrate sandwiched between adjacent ones of the second semiconductor regions.

3. The semiconductor device according to claim 2, wherein one portion of the semiconductor substrate forms a Schottky barrier junction.

4. The semiconductor device according to claim 1, wherein one portion of the semiconductor substrate forms a Schottky barrier junction.

5. The semiconductor device according to claim 1, wherein:
the first conductivity type semiconductor substrate is an n-type semiconductor substrate;
the second conductivity type first semiconductor region is a p-type anode region;
the second conductivity type guard ring region is a p-type guard ring region of high concentration; and
the conductive film is a plate electrode.

6. The semiconductor device according to claim 1, wherein the conductive film is free of any direct contact with the second conductivity type guard ring region.

7. The semiconductor device according to claim 1, wherein when the on-time voltage is applied to the conductive film at the on-time, a first of the inversion layers directly contacts both a first of the guard rings and the first semiconductor region, and a second of the inversion layers directly contacts both the first of the guard rings and a second of the guard rings.

8. A semiconductor device, comprising:
a first conductivity type semiconductor substrate;
a second conductivity type first semiconductor region that is disposed in a front surface layer of the first conductivity type semiconductor substrate;
a second conductivity type guard ring region that is a breakdown voltage structure disposed surrounding the first semiconductor region, the guard ring region including a plurality of guard rings;
an insulating film that extends from an end portion of the first semiconductor region and formed to continuously extend over the plurality of guard rings; and
a conductive film that is disposed on the semiconductor substrate so as to be sandwiched between the end portion of the first semiconductor region and an end portion of the guard ring region, and on the guard ring region via the insulating film;

wherein the guard rings are a plurality of second conductivity type second semiconductor regions each having a high concentration;

wherein the conductive film is divided into ring shapes; and wherein the divided ring-shaped conductive films are disposed, via the insulating film, on a portion of the semiconductor substrate that is sandwiched between the first semiconductor region and the guard ring region and on another portion of the semiconductor substrate sandwiched between adjacent ones of the second semiconductor regions, wherein the insulating film is formed between the second conductivity type guard ring region and the conductive film without a trench in the insulating film reaching the second conductivity type guard ring region, wherein the guard rings are disposed relative to each other and the first semiconductor region so that an on-time voltage, which is applied to the conductive film at an on-time, forms inversion layers in the front surface layer of the semiconductor substrate, the inversion layers connecting the guard rings to the first semiconductor region, and further connecting the guard rings to each other, and an off-time voltage, which is applied to the conductive film at an off-time, extinguishes the inversion layers.

9. The semiconductor device according to claim 8, wherein the conductive film is free of any direct contact with the second conductivity type guard ring region.

10. The semiconductor device according to claim 8, wherein when the on-time voltage is applied to the conductive film at the on-time, a first of the inversion layers directly contacts both a first of the guard rings and the first semiconductor region, and a second of the inversion layers directly contacts both the first of the guard rings and a second of the guard rings.

* * * * *